United States Patent
Murai et al.

(10) Patent No.: US 10,732,328 B2
(45) Date of Patent: Aug. 4, 2020

(54) WAVELENGTH CONVERSION APPARATUS AND LIGHT SOURCE APPARATUS

(71) Applicants: KYOTO UNIVERSITY, Kyoto-shi, Kyoto (JP); STANLEY ELECTRIC CO., LTD., Meguro-ku, Tokyo (JP)

(72) Inventors: Shunsuke Murai, Kyoto (JP); Yusuke Yokobayashi, Tokyo (JP)

(73) Assignees: STANLEY ELECTRIC CO., LTD., Tokyo (JP); KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 15/656,577

(22) Filed: Jul. 21, 2017

(65) Prior Publication Data

US 2018/0024279 A1    Jan. 25, 2018

(30) Foreign Application Priority Data

Jul. 22, 2016    (JP) ................................ 2016-144215

(51) Int. Cl.
    *F21V 9/30*    (2018.01)
    *G02B 5/00*    (2006.01)
    (Continued)

(52) U.S. Cl.
    CPC ............... *G02B 5/008* (2013.01); *F21V 9/30* (2018.02); *G03B 21/204* (2013.01); *H01L 33/50* (2013.01);
    (Continued)

(58) Field of Classification Search
    CPC ..... H01L 33/504; H01L 33/508; H01L 33/46; H01L 33/505; H01L 33/58; H01L 33/502;
    (Continued)

(56) References Cited

U.S. PATENT DOCUMENTS 8,446,094 B2 * 5/2013 Niigaki ................. H01J 40/06
                                                       313/103 R
2005/0006659 A1   1/2005 Ng et al.
(Continued)

FOREIGN PATENT DOCUMENTS

EP    2477240 A1    7/2012
JP    2005033211 A    2/2005
(Continued)

OTHER PUBLICATIONS

Extended European Search Report (EESR) dated Nov. 21, 2017 issued in counterpart European Application No. 17181701.8.
(Continued)

*Primary Examiner* — Thien T Mai
(74) *Attorney, Agent, or Firm* — Holtz, Holtz & Volek PC

(57) ABSTRACT

A wavelength conversion apparatus includes a wavelength conversion member that has an incident surface and an emitting surface and generates a wavelength-converted light by converting the wavelength of incident light that is incident on the incident surface and emits the wavelength-converted light from the emitting surface; and an antenna array including a plurality of antennas that are formed on the wavelength conversion member and arranged at a pitch P, which is equal to the approximate optical wavelength of the wavelength-converted light in the wavelength conversion member.

7 Claims, 6 Drawing Sheets

(51) Int. Cl.
*H01L 33/50* (2010.01)
*G03B 21/20* (2006.01)
*F21Y 115/30* (2016.01)

(52) U.S. Cl.
CPC ......... *H01L 33/507* (2013.01); *F21Y 2115/30* (2016.08)

(58) Field of Classification Search
CPC ......... H01L 33/50; H01L 33/507; F21V 9/08; F21V 9/30; F21K 9/64; C09K 11/0883; G02B 5/008; G03B 21/204; F21Y 2115/30
See application file for complete search history.

(56) References Cited

U.S. PATENT DOCUMENTS

| | | | | |
|---|---|---|---|---|
| 2007/0046176 A1* | 3/2007 | Bukesov | ............... | C09K 11/08 313/496 |
| 2008/0203901 A1* | 8/2008 | Bukesov | ............. | C09K 11/574 313/503 |
| 2012/0220471 A1* | 8/2012 | Gomez Rivas | ...... | G01N 21/648 506/7 |
| 2013/0127331 A1* | 5/2013 | Tsutsumi | .............. | H01L 33/505 313/498 |
| 2013/0286633 A1* | 10/2013 | Rodriguez | .............. | H01L 33/50 362/84 |
| 2014/0146547 A1* | 5/2014 | Tsutsumi | ................ | H01L 33/46 362/343 |
| 2016/0010813 A1 | 1/2016 | Rodriguez et al. | | |
| 2016/0190403 A1* | 6/2016 | Verschuuren | ......... | H01L 33/504 257/98 |
| 2016/0363274 A1 | 12/2016 | Rodriguez et al. | | |
| 2017/0082263 A1* | 3/2017 | Byrnes | ................... | G02B 1/007 |
| 2017/0089546 A1* | 3/2017 | Verschuuren | ......... | H01L 33/502 |
| 2017/0288098 A1 | 10/2017 | Rodriguez et al. | | |
| 2017/0350563 A1* | 12/2017 | Lunz | ......................... | F21K 9/64 |
| 2018/0216800 A1* | 8/2018 | Yamanaka | ............. | C09K 11/02 |

FOREIGN PATENT DOCUMENTS

| | | |
|---|---|---|
| JP | 2012109334 A | 6/2012 |
| WO | 2015180976 A1 | 12/2015 |

OTHER PUBLICATIONS

Japanese Office Action (and English language translation thereof) dated Mar. 24, 2020 issued in counterpart Japanese Application No. 2016-144215.

* cited by examiner

WAVELENGTH CONVERSION APPARATUS AND LIGHT SOURCE APPARATUS

BACKGROUND OF THE INVENTION

1. Field of the Invention

The present invention relates to a wavelength conversion apparatus and a light source apparatus including the wavelength conversion apparatus.

2. Description of the Related Art

Conventionally, a light source including a light-emitting apparatus and a wavelength conversion apparatus that converts the wavelength of light from the light-emitting apparatus is known as a light source that acquires light with a light-emitting color (or spectrum). For example, the wavelength conversion apparatus includes a fluorescent material as a wavelength conversion member. By mixing the colors from excitation light from the light-emitting apparatus and the fluorescence of the fluorescent material, light with a desired spectrum can be extracted from the light source. For example, Patent Literature 1 (Japanese Patent Application Laid-Open No. 2005-33211) discloses a light source including: a chip with a main light source; and a cap provided with a wavelength conversion material that converts light with a first wavelength from the chip into light with a second wavelength.

SUMMARY OF THE INVENTION

A wavelength conversion apparatus including a wavelength conversion member, such as a fluorescent material, typically has problems in terms of the color and intensity unevenness of light from the wavelength conversion member and light extraction efficiency. For example, light whose wavelength has been converted in a fluorescent material is diffused in all directions. As the refractive index of a fluorescent material is typically high, part of wavelength-converted light is not emitted to the outside due to total reflection and is attenuated or dissipated in the fluorescent material. For example, the refractive index of a YAG:Ce fluorescent material, which is the most commonly used type of white color light source, is approximately 1.82. The total reflection angle is approximately 30° when the external medium is air. Most part of the light are not extracted from inside the fluorescent material. In recent years, by using a light-emitting diode, a semiconductor laser, etc., a wavelength conversion apparatus can readily be irradiated with high-density and high-power light. However, excitation of a wavelength conversion member by high-density and high-power light causes deterioration of the wavelength conversion efficiency of the wavelength conversion member, such as luminance saturation or temperature quenching. Color unevenness (color mixture) or intensity unevenness is thereby generated.

For example, when a lighting device is configured using wavelength-converted light from a wavelength conversion apparatus, an optical system, such as a projection lens, is provided to acquire a desired light distribution. However, the distribution of the wavelength-converted light is lambertian light distribution whereby the light is isotropically diffused from the emitting surface of the wavelength conversion member. To extract a large amount of light, the size of the projection lens need to be increased to increase its weight. This causes an increase in the size of the entire light source apparatus.

The present invention has been made to address the above problems. An object of the present invention is to provide a small-sized wavelength conversion apparatus and light source apparatus that can restrain color unevenness and intensity unevenness and achieve a high level of light extraction efficiency.

A wavelength conversion apparatus according to the present invention includes: a wavelength conversion member having an incident surface and an emitting surface, the wavelength conversion member generating wavelength-converted light by converting a wavelength of incident light that is incident on the incident surface to emit the wavelength-converted light from the emitting surface; and an antenna array including a plurality of antennas that are formed on the wavelength conversion member and arranged at a pitch, which is equal to an approximate optical wavelength of the wavelength-converted light in the wavelength conversion member.

DETAILED DESCRIPTION OF THE INVENTION

Embodiments of the present invention will now be described in detail.

First Embodiment

Figure 1:
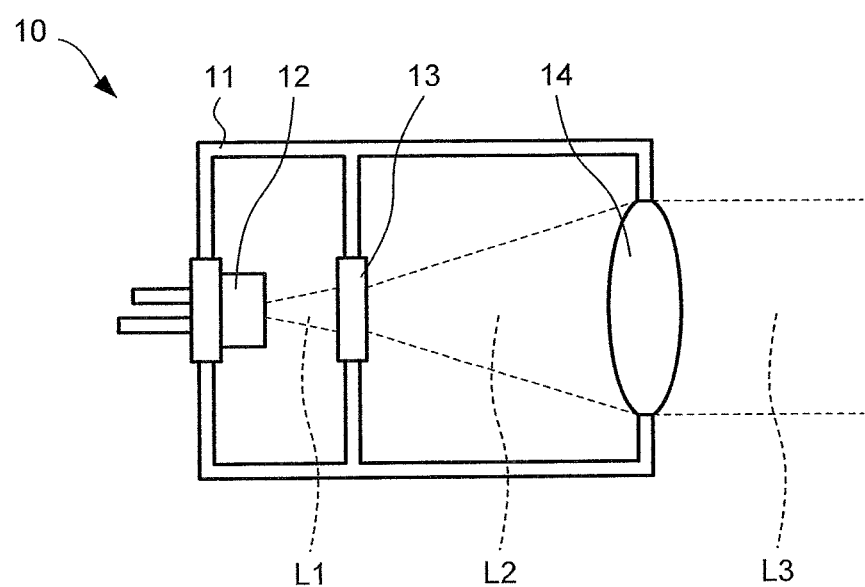
FIG. 1 is a schematic view illustrating a configuration of a light source apparatus according to a first embodiment.

FIG. 1 is a schematic view illustrating a configuration of a light source apparatus 10 according to a first embodiment. The light source apparatus 10 includes a light source 12, a wavelength conversion apparatus 13, and a projection lens 14, all of which are housed in a casing 11. In this embodiment, the light source 12 is a laser light source of, for example, a semiconductor laser. The light source 12 generates primary light L1. The wavelength conversion apparatus 13 receives the primary light L1, performs wavelength conversion, and generates secondary light L2 containing transmitted light whose wavelength has not been converted and wavelength-converted light. The projection lens 14 transforms the light distribution of the secondary light L2 into a desired form and generates illumination light L3. The illumination light L3 is extracted to the outside of the casing 11.

The casing 11 is provided with an opening for fixing the wavelength conversion apparatus 13 and an opening for fixing the projection lens 14. The wavelength conversion apparatus 13 is disposed between a light-emitting portion of the light source 12 and the projection lens 14. The wavelength conversion apparatus 13 and the projection lens 14 are disposed along the optical axis of the primary light L1.

Figure 2A:
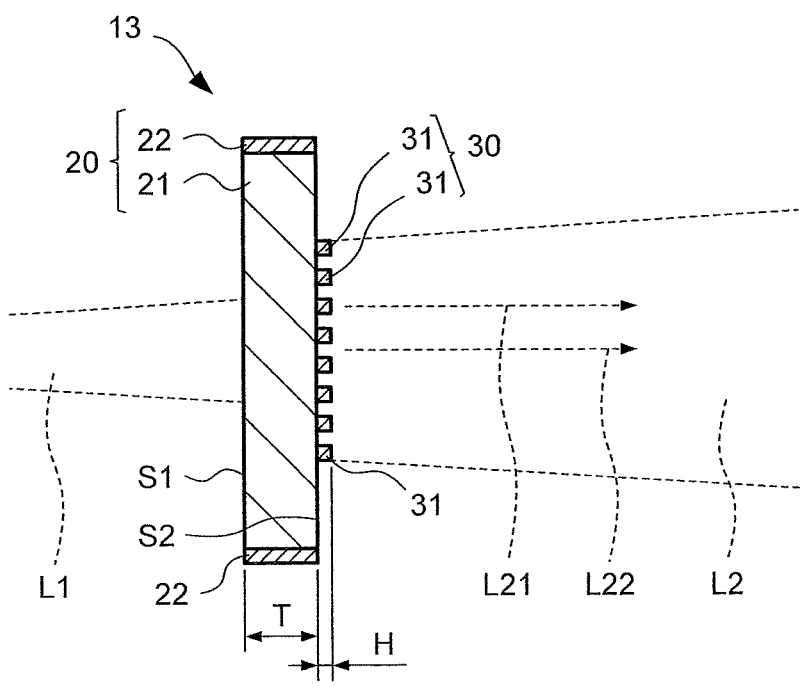
FIG. 2A is a cross-sectional view of a wavelength conversion apparatus of the light source apparatus according to the first embodiment.
Figure 2B:
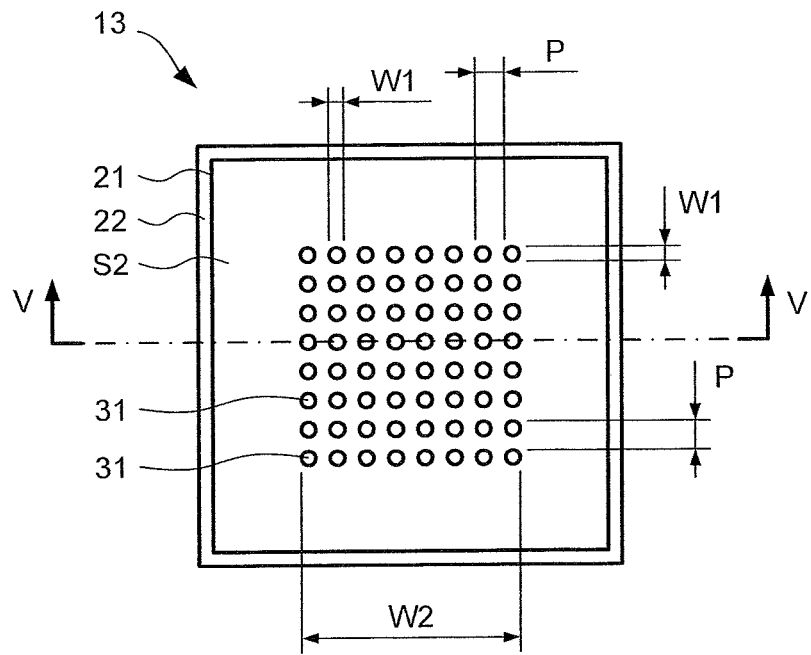
FIG. 2B is a top plan view of the wavelength conversion apparatus.

FIG. 2A is a cross-sectional view of the wavelength conversion apparatus 13. FIG. 2B is a top plan view of the wavelength conversion apparatus 13. Also, FIG. 2A is a cross-sectional view taken along line V-V of FIG. 2B. As illustrated in FIG. 2A, the wavelength conversion apparatus 13 includes: a wavelength conversion member 20 including a fluorescent material plate 21 and a light reflection film 22; and an antenna array 30 including a plurality of antennas 31 formed on the wavelength conversion member 20.

A description will first be given of the wavelength conversion member 20. The wavelength conversion member 20 includes: an incident surface S1, on which the primary light L1 is incident; and an emitting surface S2, from which the secondary light L2 is emitted. In this embodiment, the fluorescent material plate 21 has a flat plate shape. One of the main surfaces is the incident surface S1, and the other main surface is the emitting surface S2. Specifically, the primary light L1 is incident on the incident surface S1 of the wavelength conversion member 20, which is one of the main surfaces of the fluorescent material plate 21, and is emitted from the emitting surface S2 of the wavelength conversion member 20, which is the other main surface of the fluorescent material plate 21.

The secondary light L2, which is emitted from the emitting surface S2 of the wavelength conversion member 20, contains: wavelength-converted light L21, whose wavelength has been converted by the wavelength conversion member 20; and transmitted light (i.e. primary light whose wavelength has not been converted) L22 that has transmitted through the wavelength conversion member 20. Specifically, the wavelength conversion member 20 converts the wavelength of part of the primary light L1, which has been made incident on the incident surface S1, and generates the wavelength-converted light L21.

In the following description, the primary light L1 is sometimes referred to as incident light into the wavelength conversion member 20. In other words, the wavelength conversion member 20 includes the incident surface S1 and the emitting surface S2. Also, the wavelength conversion member 20 is configured to convert the wavelength of the incident light L1, which has been made incident on the incident surface S1, generate the wavelength-converted light L21, and emit the wavelength-converted light L21 and the transmitted light L22 from the emitting surface S2. In this embodiment, the wavelength conversion member 20 is disposed so that the incident surface S1 thereof is perpendicular to the optical axis of the incident light L1.

In this embodiment, the fluorescent material plate 21 is a ceramic fluorescent material plate formed from a single phase of yttrium•aluminum•garnet (YAG:Ce) whose luminescence center is cerium. The light source 12 is a semiconductor laser whose light-emitting layer is an InGaN-based semiconductor. In this embodiment, the primary light L1 is blue light with a wavelength of approximately 450 nm. The wavelength-converted light L21 is yellow light with a wavelength of approximately 460 to 750 nm, and the secondary light L2 is white light which is a mixture of yellow light and blue light. It is preferable that the fluorescent material plate 21 have a thickness T of 40 to 200 μm to perform stable whitening of light.

The light reflection film 22 is disposed on the side surface of the fluorescent material plate 21. The light reflection film 22 is, for example, a white coating material film formed on the side surface of the fluorescent material plate 21. The light reflection film 22 may be replaced with a light absorption film, such as a black coating material.

Hereinbelow, a description will be given of the antenna array 30. In this embodiment, the antenna array 30 includes the plurality of antennas 31 that are formed on the emitting surface S2 of the wavelength conversion member 20 and are arranged at a pitch P, which is equal to the approximate optical wavelength of the wavelength-converted light L21 in the wavelength conversion member 20. Each of the plurality of antennas 31 is a columnar or conical metal protrusion in this embodiment. In this embodiment, each of the plurality of antennas 31 has a cylindrical shape and includes a material that has a plasma frequency in the visible light region of Au (gold), Ag (silver), Cu (copper), Pt (platinum), Pd (palladium), Al (aluminum), Ni (nickel), or the like, or an alloy or laminate containing these substances.

In this embodiment, the antennas 31 each have an almost equal antenna height (H) and antenna width (or diameter) W1. When the antenna 31 has a columnar or conical shape, the antenna width W1 refers to the maximum width of the antenna 31. In this embodiment, the plurality of antennas 31 are arranged at the pitch P in a square lattice shape on the emitting surface S2 of the wavelength conversion member 20. The antenna array 30 with an array width of W2 is formed in a square shape at the central portion of the emitting surface S2.

In this embodiment, the antenna width W1 is 150±20 nm, and the array width W2 is 6 mm. The refractive index of the YAG:Ce fluorescent material is approximately 1.82, and the fluorescent material emits light with a wavelength of 460 to 750 nm. Thereby, the optical wavelength is calculated by (light-emitting wavelength/refractive index), and the antenna pitch P ranges preferably from 250 nm to 420 nm. As the light-emitting intensity of the YAG:Ce fluorescent material is high in a wavelength region of 500 nm or greater, the range of the antenna pitch P is set to preferably 300 nm to 420 nm.

When each of the antennas 31 of the antenna array 30 is irradiated with light, the electric field intensity increases near the antenna 31 due to localized surface plasmon resonance on the surface of the antenna 31. By setting the arrangement pitch P of the antenna 31 to the approximate optical wavelength of the wavelength-converted light L21, resonance is induced through optical diffraction due to localized surface plasmon resonance of each of the adjacent antennas 31. A further increase in the electric field intensity occurs, and the light extraction efficiency of the wavelength-converted light L21 increases. In this description, the approximate optical wavelength of the wavelength-converted light L21 in the wavelength conversion member 20 is, for example, the wavelength bandwidth within 50 nm of the light-emitting wavelength band of the fluorescent material in the fluorescent material plate 21.

The wavelength-converted light L21 from the wavelength conversion member 20 is thereby amplified, and the light is distributed in a narrow-angle form (i.e., low etendue) and emitted from the antenna array 30. Specifically, the antenna array 30 intensifies light in the wavelength conversion member 20 and narrow the direction in which the secondary light L2 (wavelength-converted light L21) is emitted.

Figure 3:
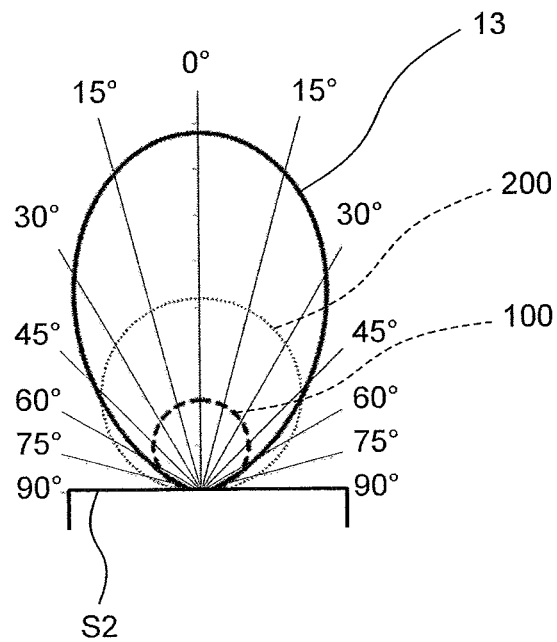
FIG. 3 is a view illustrating a relationship between an intensity and a light-emitting angle of light emitted from the wavelength conversion apparatus of the light source apparatus according to the first embodiment.

FIG. 3 is a schematic view illustrating the relationship between the light-emitting angle and light-emitting intensity (or luminous intensity) of the wavelength-converted light L21 from the wavelength conversion apparatus 13. FIG. 3 is a view illustrating the intensity distribution of the wavelength-converted light L21 when the angle from the center of the antenna array 30 to the normal direction of the emitting surface S2 (front surface direction) of the wavelength conversion member 20 is set to 0° and the angle of the direction parallel to the emitting surface S2 is set to 90°. The wavelength conversion apparatus 13 was compared with a wavelength conversion apparatus 100 and a wavelength conversion apparatus 200 in terms of intensity distribution. The configuration of the wavelength conversion apparatus 100 is the same as that of the wavelength conversion apparatus 13 except that the former does not have the antenna array 30. The wavelength conversion apparatus 200 has the same intensity distribution as that of the wavelength conversion apparatus 100, the same total luminous flux as that of the wavelength conversion apparatus 13, and ordinary lambertian light distribution.

As illustrated in FIG. 3, below approximately 60°, the intensity of the wavelength conversion apparatus 13 of this embodiment is higher than the intensity of the wavelength conversion apparatus 100, which is a comparative example. The total luminous flux, which is calculated from the intensity distribution of the wavelength conversion apparatus 13, is approximately twice higher than that of the wavelength conversion apparatus 100. Specifically, a large amount of light is extracted from the wavelength conversion member 20 and travels in a direction near perpendicular to the emitting surface S2. This is caused by the antenna action (i.e., enhanced intensity emission and narrow-angle emission) of the antenna array 30 using the aforementioned localized surface plasmon resonance and optical diffraction. The total luminous flux of the wavelength conversion apparatus 13 is the same as that of the wavelength conversion apparatus 200. However, the intensity of the former is higher than that of the latter below approximately 45° and twice higher in the front surface direction (0°, i.e. normal direction).

As the wavelength conversion apparatus 13 has the plurality of antennas 31 arranged at a nanometer (or submicron) pitch, whereby the wavelength-converted light L21 can be distributed in a narrow-angle form (or low etendue) and extracted at a high light extraction efficiency. As in the case of this embodiment, a laser light source is used as the light source 13 that generates the primary light L1. By taking advantage of the narrow-angle light distribution and high-output characteristics of a laser light source, the primary light L1 and secondary light L2 (in other words, the wavelength-converted light L21 and transmitted light L22, respectively) can be matched in terms of light distribution and intensity distribution. It is thus possible to provide the wavelength conversion apparatus 13 and light source apparatus 10 that can suppress color unevenness and intensity unevenness and achieve a high light extraction efficiency.

Figure 4:
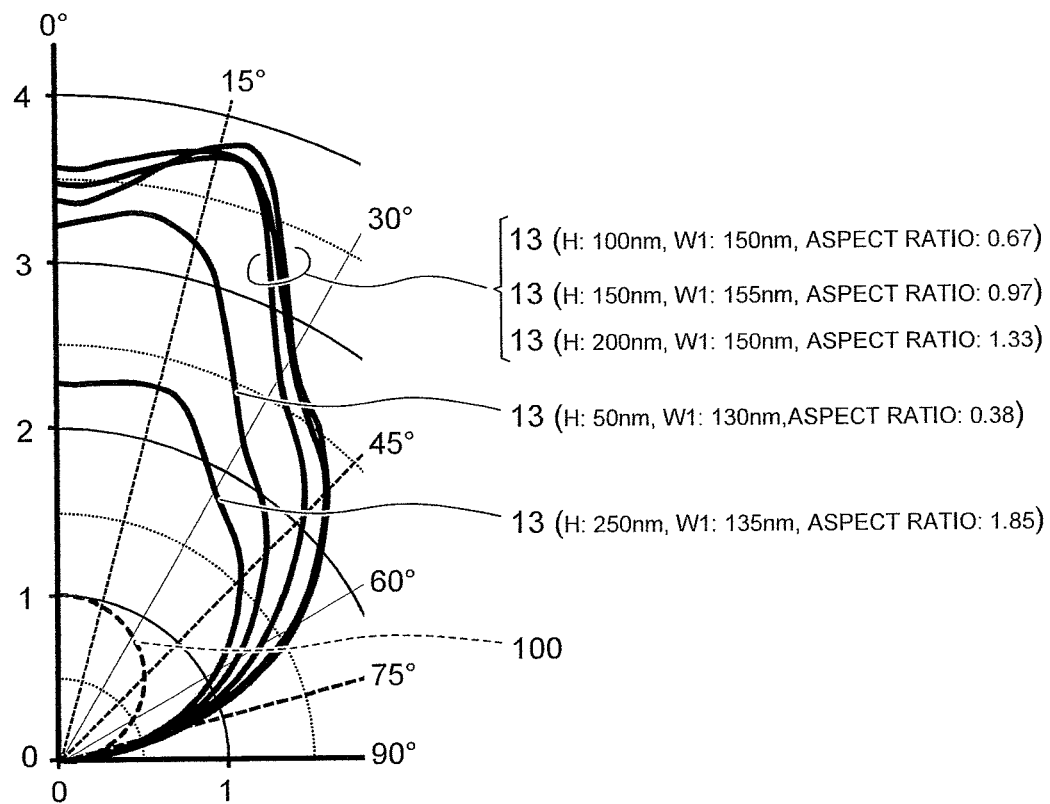
FIG. 4 is a view illustrating a relationship between a light-emitting angle and a light-emitting intensity depending on an antenna height and an aspect ratio in the wavelength conversion apparatus of the light source apparatus according to the first embodiment.

FIG. 4 is a view illustrating the relationship between the light-emitting angle and light intensity of the wavelength conversion apparatus 13 when the antenna height varies between 50 nm and 250 nm. To create the setting of FIG. 4, Al is used as a material of the antenna array 30, and five wavelength conversion apparatuses 13 with different antenna heights H are produced so that the height H increases in increments of 50 nm. Between the normal direction (0°) of the emitting surface S2 and the direction parallel to the emitting surface S2 (90°), optical detectors were disposed at different locations to measure the light intensity at the respective angles. Here, the wavelength of the primary light L1 from the light source 13 was approximately 445 nm, and the antenna array 30 was produced so that the antenna pitch P was approximately 400 nm, and the antenna width W1 was approximately 150 nm. Although not illustrated in the drawings, the collimate optical system was disposed between the light source 12 and the wavelength conversion apparatus 13. The measured light intensities were plotted on the polar coordinate.

The aspect ratio (H/W1) of the antenna 31 of each of the wavelength conversion apparatuses 13 was calculated, and the results are described in FIG. 4. The antenna was produced so that the antenna width W1 was roughly 150 nm, and the actual antenna width W1 was measured using SEM images. The antenna height H was measured using a probe-type step profiler, and it was confirmed that the target antenna heights H (50 nm, 100 nm, 150 nm, 200 nm, and 250 nm) were achieved in the respective antenna arrays 30.

As illustrated in FIG. 4, the intensities of all the five wavelength conversion apparatuses 13 with the antenna array 30 are greater than that of the wavelength conversion apparatus 100 without the antenna array 30. The three wavelength conversion apparatuses 13 with the antenna height H ranging from 100 to 200 nm (aspect ratio ranging from approximately 0.6 to 1.4) have intensity distribution greater than those of the wavelength conversion apparatuses with the antenna heights H other than the aforementioned antenna heights H. The aforementioned three wavelength conversion apparatuses 13 have similar intensity distribution of narrow-angle emission.

Figure 5:
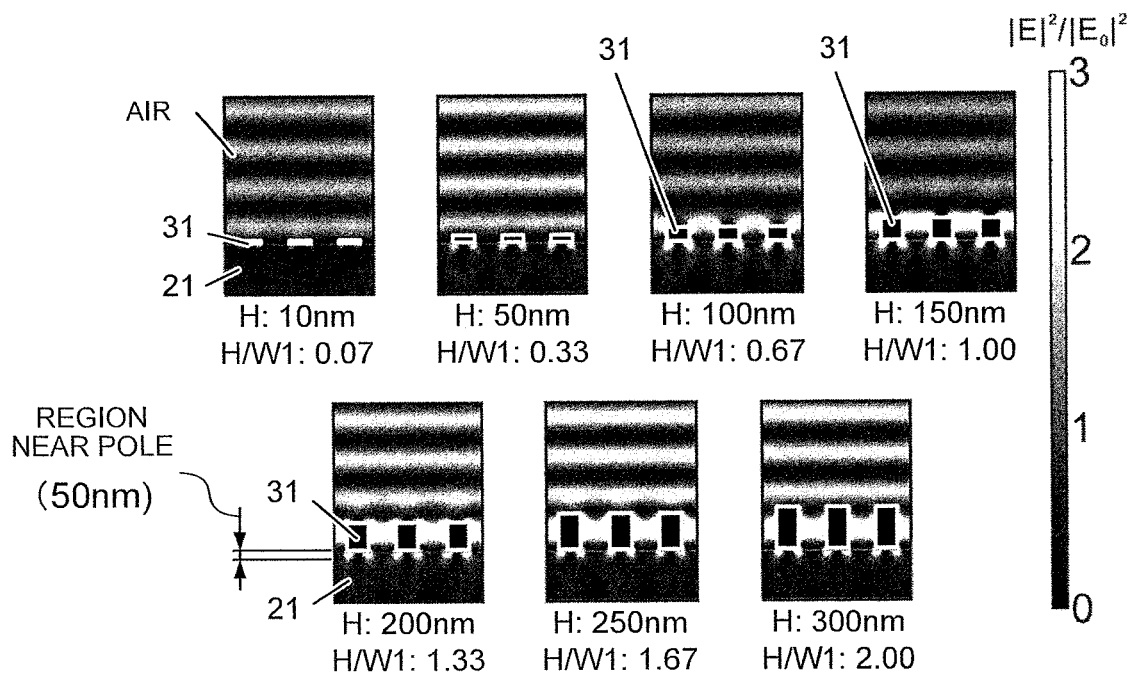
FIG. 5 is a view schematically illustrating a relationship between a level of electric field intensification near the antenna and the antenna height and the aspect ratio in the wavelength conversion apparatus of the light source apparatus according to the first embodiment.

A description will next be given of a more preferred configuration of the antenna array 30. FIG. 5 is a view where the finite element method is used to simulate the electric field intensification ($|E|^2/|E_0|^2$) near the antenna array 30 of the wavelength conversion apparatus 13. The simulation was conducted for the case where the antenna width W1 was 150 nm and the antenna heights H were 10 nm, 50 nm, 100 nm, 150 nm, 200 nm, 250 nm, and 300 nm (aspect ratio ranging from 0.07 to 2.00). As in the case of the example, a YAG:Ce fluorescent material, Al, and air were used as the fluorescent material plate 21, the antenna array 30, and the external medium, respectively. Electric field intensification ($|E|^2/|E_0|^2$) was calculated by setting the electric field intensity of the wavelength conversion apparatus 100 without the antenna 31 to $E_0$ and the electric field intensity of the wavelength conversion apparatus 13 with the antenna 31 to E.

FIG. 5 illustrates that the remaining amount of the wavelength-converted light L21 increases with an increase in electric field intensification ($|E|^2/|E_0|^2$) in the fluorescent material plate 21 (captured by the antenna array 30 due to localized surface plasmon resonance) and that the wavelength conversion efficiency is enhanced. Electric field intensification in the air is preferably small as it leads to an increase of reflection components that hinders extraction of the wavelength-converted light L21 and the transmitted light L22. It is possible to acknowledge that electric field intensification is occurring in the fluorescent material plate 21 at the antenna height H of 50 nm or higher. When the antenna height H is 100 nm or higher, particularly high electric field intensification was observed near the pole at an end portion of the antenna 31 on the surface of the fluorescent material plate 21. Electric field intensification in the air has been found to be high when the antenna height H is 50 nm and 200 nm or higher.

Figure 6:
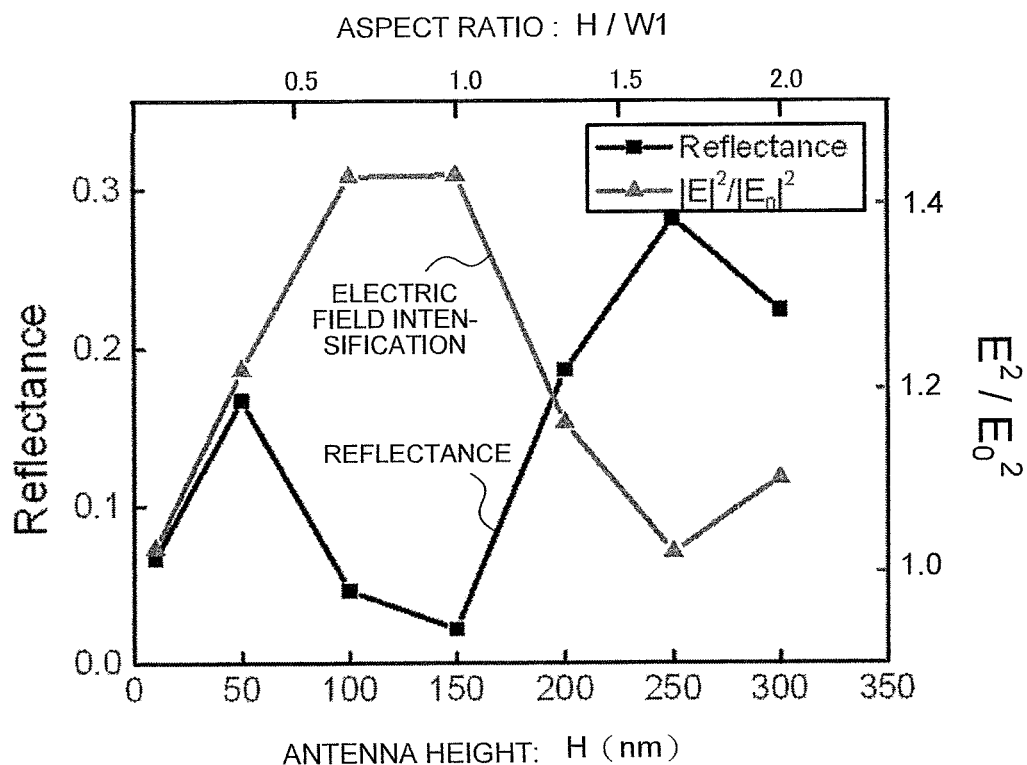
FIG. 6 is a view schematically illustrating a relationship between the level of electric field intensification near the antenna and the antenna height and the aspect ratio in the wavelength conversion apparatus of the light source apparatus according to the first embodiment.

FIG. 6 is a view illustrating the relationship of the aspect ratio (i.e., antenna height H/antenna width W1) of the antenna 31 and the level of electric field intensification ($|E|^2/|E_0|^2$) in the fluorescent material plate 21 calculated in the aforementioned simulation and the reflectance of the antenna array 30. The lower horizontal axis of FIG. 6 represents the antenna height H, and the upper horizontal axis represents the aspect ratio.

The right vertical axis of FIG. 6 represents the level of electric field intensification ($|E|^2/|E_0|^2$), and left vertical axis represents the reflectance of the antenna array 30. The level of electric field intensification in the fluorescent material plate 21 is calculated for the region near the pole of the antenna array 30, which particularly substantially affects the wavelength conversion efficiency and light extraction efficiency. Specifically, the level of electric field intensification was surveyed for the region of the fluorescent material plate 21 from the surface of the fluorescent material plate 21 to a depth of 50 nm from the surface. The reflectance of the antenna array 30 is calculated from the integrated value of the level of electric field intensification in the air.

As illustrated in FIG. 6, the level of electric field intensification near the pole of the antenna array 30, specifically, the wavelength conversion efficiency and light extraction efficiency of the wavelength conversion apparatus 13, also have correlation to the aspect ratio of the antenna 31. Specifically, as illustrated in FIG. 6, when the antenna width W1 is 150 nm and the antenna height H ranges from 50 nm to 200 nm, the level of electric field intensification ($|E|^2/|E_0|^2$) of the antenna 31 is well above 1.0. Thus, the electric field intensification effect of the antenna array 30 can be seen.

FIG. 6 illustrates that the level of electric field intensification and reflectance at the antenna height of 50 nm, or the aspect ratio (H/W1) of 0.33, are the same as those at the antenna height of 200 nm, or the aspect ratio (H/W1) of 1.33. However, in the example, as can be seen in FIG. 4, the level of electric field intensification or light extraction efficiency achieved by the wavelength conversion apparatus 13 with the antenna height H of 200 nm is higher than that of the wavelength conversion apparatus 13 with the antenna height H of 50 nm. This is probably because, as illustrated in FIG. 5, the level of electric field intensification converged near the pole at an end portion of the antenna 31 is greater when the antenna height H is 200 nm than when the antenna height H is 50 nm. Specifically, (local) convergence of a high level of electric field intensification near the pole of the antenna 31 is likely to contribute to enhancement of the light extraction efficiency using optical diffraction. On the basis of the foregoing results, the preferable range of the antenna height H is between 100 nm and 200 nm.

As illustrated in FIG. 6, it is preferable that the antenna width W1 and the antenna height H of the antenna 31 satisfy a relationship of $0.6 \leq (H/W1) \leq 1.4$. The aspect ratio of 1 is particularly preferable as the level of electric field intensification is maximum and the reflectance is minimum. This may be because, when the aspect ratio of the antenna 31 is 1, resonance induced by optical diffraction due to localized surface plasmon resonance of each of the adjacent antennas 31 is maximum, and the level of electric field intensification in the fluorescent material plate 21 increases and converges near the pole of the antenna 31.

In other words, the wavelength conversion efficiency and light extraction efficiency of the wavelength conversion apparatus 13 depend on the aspect ratio of the antenna 31. By optimizing the configuration of the antenna 31 on the basis of this aspect ratio (H/W1), a high level of wavelength conversion efficiency and light extraction efficiency can be achieved.

When the light source apparatus 10 is used as a lighting device, it is preferable that a material used in the antenna 31 have a plasma frequency of localized surface plasmon resonance in the light-emitting wavelength range of a fluorescent material to be used. In view of the foregoing, it is preferable that the antenna 31 using a YAG:Ce fluorescent material be formed from Ag (silver) or Al (aluminum).

In this embodiment, the case where the antennas 31 are arranged in a square lattice form has been described, but the arrangement of the antennas 31 is not limited to this form. The antennas 31 may be arranged at a certain pitch and in the form of, for example, triangular, hexagonal, or rectangular lattice. For example, in a rectangular lattice form, i.e., when the antennas 31 have different pitches P and Q in a plurality of directions (for example, x and y direction orthogonal to each other) on the emitting surface S2 of the wavelength conversion member 20, the pitches P and Q are preferably equal to the approximate optical wavelength of the secondary light L2 in the wavelength conversion member 20.

Figure 7:
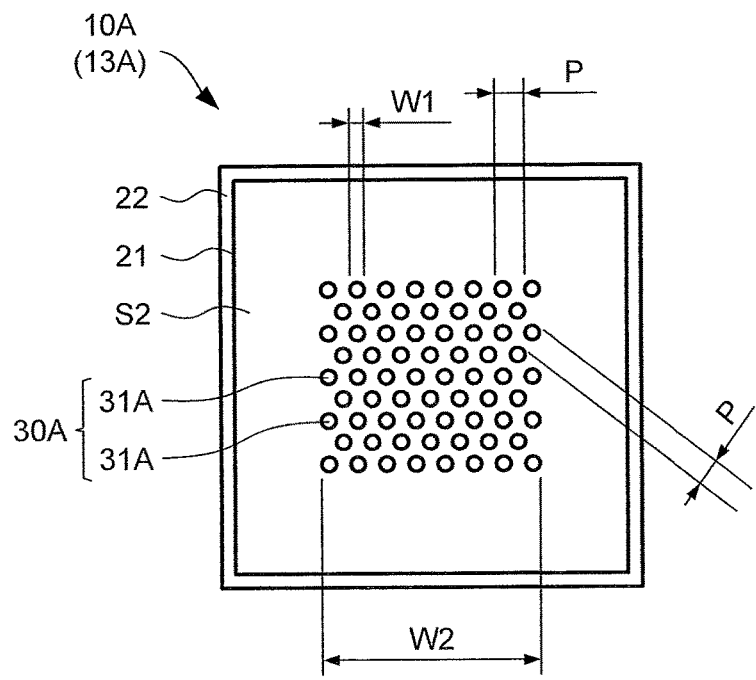
FIG. 7 is a top plan view of a wavelength conversion apparatus of a light source apparatus according to a modified example of the first embodiment.

FIG. 7 is a top plan view of a wavelength conversion apparatus 13A of a light source apparatus 10A according to a modified example of the aforementioned embodiment. As illustrated in FIG. 7, the wavelength conversion apparatus 13A has an antenna array 30A that includes a plurality of antennas 31A arranged in a triangular lattice form at the pitch P. The antennas 31A may be arranged in a triangular lattice form as in the case of this modified example. In this modified example, the antennas 31A are arranged at the pitch P in all the three directions.

Figure 8:
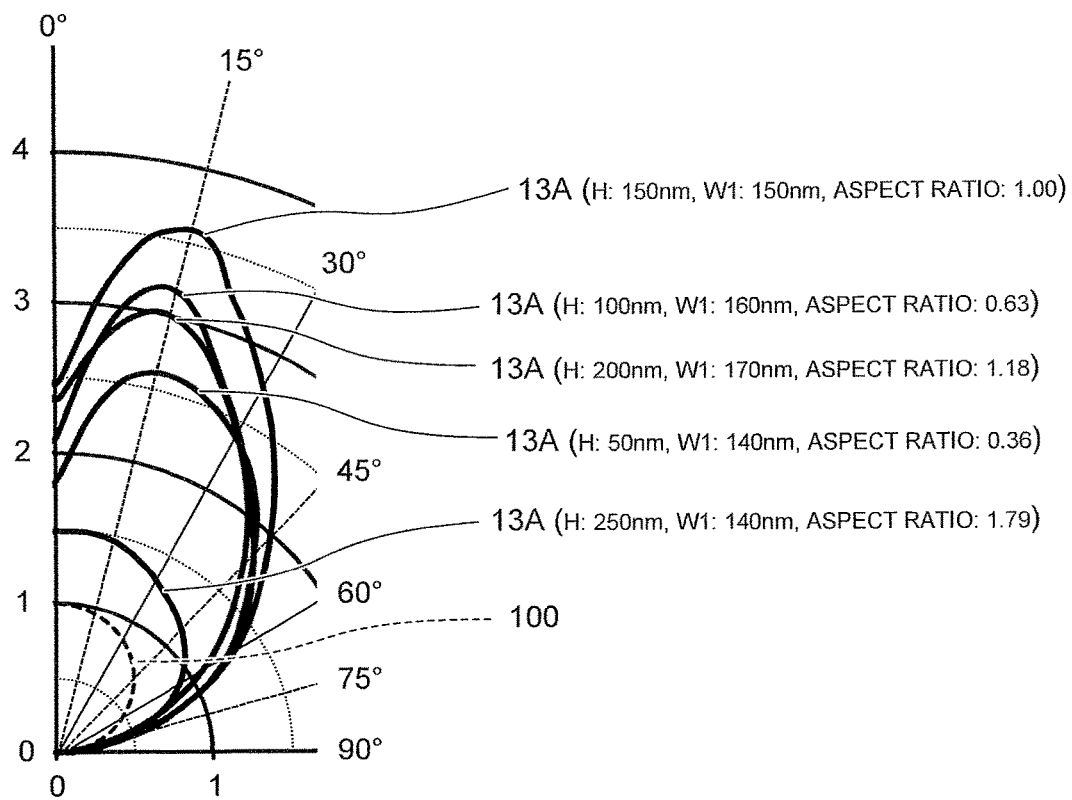
FIG. 8 is a view illustrating a relationship between a light-emitting angle and a light-emitting intensity depending on an antenna height and an aspect ratio in the wavelength conversion apparatus of the light source apparatus according to the modified example of the first embodiment.
Figure 9:
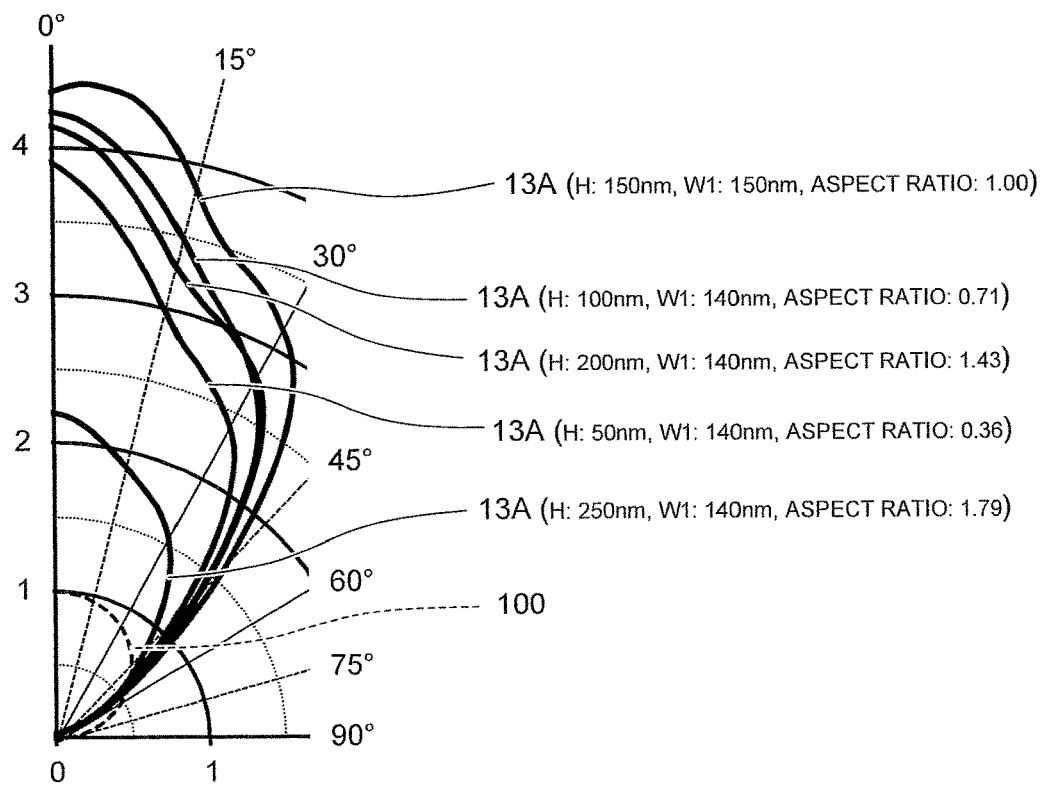
FIG. 9 is a view illustrating the relationship between the light-emitting angle and the light-emitting intensity depending on the antenna height and the aspect ratio in the wavelength conversion apparatus of the light source apparatus according to the modified example of the first embodiment.
Figure 10:
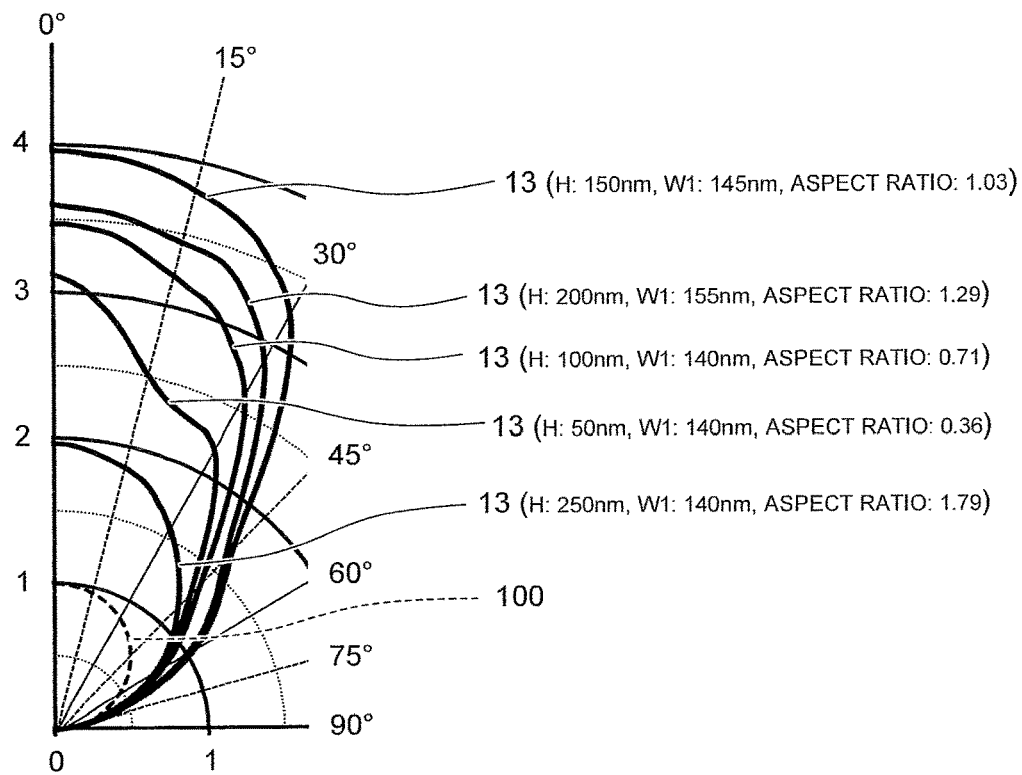
FIG. 10 is a view illustrating the relationship between the light-emitting angle and the light-emitting intensity depending on the antenna height and the aspect ratio in the wavelength conversion apparatus of the light source apparatus according to the first embodiment.

FIGS. 8 to 10 illustrate the light distribution of the wavelength conversion apparatus 13 or 13A, in which the antenna pitch P is different in each case. FIG. 8 illustrates the light distribution when the wavelength conversion apparatus 13A has the antennas 31A in a triangular lattice form and the pitch P is 350 nm. FIG. 9 illustrates the light distribution when the wavelength conversion apparatus 13A has the antennas 31A in a triangular lattice form and the pitch P is 400 nm. FIG. 10 illustrates the light distribution when the wavelength conversion apparatus 13 has the antennas 31 in a square lattice form and the pitch P is 350 nm. In each case, the wavelength conversion apparatus 13 or 13A was produced in the same configuration as that of the aforementioned embodiment or its modified example except for the antenna arrangement and the pitch P. In each case, the form of light distribution was different, but the wavelength conversion efficiency and light extraction efficiency were relatively high in the range of $0.6 \leq (H/W1) \leq 1.4$ in all the cases. These two types of efficiency have been confirmed to be most preferable when $H/W1=1$ holds true.

When the antenna width W1 is smaller than 100 nm, it is too small for visible light, and a sufficient increase in the wavelength conversion efficiency cannot be therefore expected. The antenna width W1 is preferably greater than or equal to 100 nm. More preferably, the relationship between the antenna width W1 and the pitch P is represented by $0.3P \leq W1 \leq 0.7P$. When the antenna width W1 is smaller than the above range, the scattering cross section due to the antenna array 30 is small, and sufficiently strong localized surface plasmon resonance cannot be acquired. When the antenna width W1 is greater than the above range, the occupation area of the antenna array 30 on the emitting surface S2 increases. A greater percentage of the incident light L1 and the wavelength-converted light L2 is absorbed by the antenna array 30, and the light extraction efficiency decreases.

In this embodiment, the case where the fluorescent material plate 21 is formed from a single phase yttrium•aluminum•garnet (YAG:Ce) has been described. However, the fluorescent material plate 21 may be a plate, for example, whose medium is a glass or resin containing a fluorescent material particle. The aforementioned shape of the fluorescent material plate 21 is simply one example. The case of disposing the light reflection film 22 on the side surface of the fluorescent material plate 21 has been described. However, the light reflection film 22 does not need to be disposed depending on the required light distribution. For example, in addition to the white color coating material described in this embodiment, an optical multi-layer reflective film, a metal reflective film, or a combination thereof may be used to form a reflective member.

In this embodiment, the incident surface S1 of the wavelength conversion apparatus 13 is configured so that the fluorescent material plate 21 is exposed. However, the configuration of the incident surface S1 is not limited to the aforementioned configuration. For example, to enhance the efficiency of incidence of the primary light L1 into the fluorescent material plate 21, a reflection prevention film (AR coat) or uneven structure may be formed on the surface of the incident surface S1 of the fluorescent material plate 21. The antenna array 30 radiates the wavelength-converted light L21 in a narrow angle to the side of the incident surface S1. Specifically, the wavelength-converted light L21, whose light distribution is the same as that illustrated in FIG. 5, is radiated from the emitting surface S2 to the incident surface S1 with the emitting surface S2 being a symmetric surface. An optical multi-layer reflective film (dichroic mirror) that transmits the primary light L1 and selectively reflects the wavelength-converted light L21 that is directed to the incident surface S1 can be formed on the incident surface S1, so that the efficiency of the wavelength conversion apparatus 13 can be further enhanced.

In this embodiment, the case where the light source 12 is a laser light source has been described, but the light source 12 is not limited to a laser light source. For example, the light source 12 may be a light-emitting diode. Various types of optical systems, such as the collimate and condensing optical systems, may be disposed between the light source 12 and the wavelength conversion apparatus 13. By disposing and combining optical systems, the light distribution of the primary light L1 can be formed in a desired shape. The efficiency of incidence of the primary light L1 into the fluorescent material plate 21 can also be enhanced, and the light distribution of the secondary light L2 (transmitted light L22) can also be made as identical as possible to that of the wavelength-converted light L21 to further reduce color unevenness. The aforementioned configuration of the light source apparatus 10 is simply one example. The light source apparatus 10 may not have to have the projection lens 14 and may have, on the casing 11, an opening for extracting the secondary light L2 to the outside.

In this embodiment, the antenna array 30 is formed on the emitting surface S2 of the fluorescent material plate 21, but the antenna array 30 may be formed on the side of the incident surface S1. However, it is preferable to form the antenna array 30 on the emitting surface S2. Specifically, the antenna array 30 partially reflects and absorbs the primary light L1 (transmitted light L22). When the antenna array 30 is formed on the incident surface S1, the primary light L1 is partially reflected and absorbed prior to be incident on the fluorescent material plate 21, and the efficiency of the light source apparatus 10 decreases. As in the case of the embodiment, it is preferable that the antenna array 30 be formed on the emitting surface S2 of the fluorescent material plate 21 so that the wavelength of the primary light L1 is sufficiently converted and the secondary light L2 is radiated via the emitting surface S2 and the antenna array 30.

To protect the antenna array 30 from damage and enhance the stability of the shape thereof, the antenna array 30 and the emitting surface S2 may be covered with a protective film, such as an oxide film. For example, when Al is used in the antenna array 30, by means of heating and being left to stand in an oxygen-containing atmosphere, an oxide film ($Al_2O_3$) can be readily formed on the surface of the antenna 31. The thickness of the formed oxide film is 1 nm or smaller, and a protective film can be formed without adversely affecting the optical properties of the antenna array 30.

In this embodiment, the incident surface S1 is a surface opposite to the emitting surface S2 of the fluorescent material plate 21, but any surface of the fluorescent material plate 21 may be the incident surface S1. Specifically, the primary light L1 may be incident on any surface of the fluorescent material plate 21, such as the side surface, incident surface S1, or emitting surface S2, or a plurality of surfaces thereof. In any case, an opening of the light source apparatus 10 or the projection lens 14 is disposed on the normal line of the emitting surface S2. A single surface may be used as both the incident surface S1 and the emitting surface S2. In such a case, it is preferable to form a reflective film on the surface opposite to the incident surface S1 and the emitting surface S2 of the fluorescent material plate 21.

As described above, in this embodiment, the wavelength conversion apparatus 13 includes: the wavelength conversion member 20 that has the incident surface S1 and the emitting surface S2 and generates the wavelength-converted light L21 by converting the wavelength of the incident light L1 that is incident on the incident surface S1 and emits the wavelength-converted light L21 from the emitting surface S2; and the antenna array 30 including the plurality of antennas 31 that are formed on the wavelength conversion member 20 and arranged at the pitch P, which is equal to the approximate optical wavelength of the wavelength-converted light L21 in the wavelength conversion member 20. It is possible to provide the light source apparatus 10 and wavelength conversion apparatus 13 that can restrain color and intensity unevenness and achieve a high level of light extraction efficiency with low etendue.

This application is based on a Japanese Patent Application No. 2016-144215 which is hereby incorporated by reference.

What is claimed is:

1. A light source apparatus comprising:
a laser light source which emits blue laser light;
a wavelength conversion member having a flat incident surface and a flat emitting surface, the wavelength conversion member generating wavelength-converted light by converting a wavelength of the blue laser light incident on the incident surface to emit the wavelength-converted light from the emitting surface, and the wavelength conversion member including a ceramic fluorescent material plate formed from a single phase yttrium aluminum garnet (YAG:Ce) ceramic;
a collimating optical system or a condensing optical system disposed between the laser light source and the wavelength conversion member; and
an antenna array including a plurality of antennas that are protrusions formed on the emitting surface of the wavelength conversion member and arranged at a pitch within a range of 300 nm to 420 nm, wherein each of the plurality of antennas are separated from each other on the emitting surface.

2. The light source apparatus according to claim 1, wherein each of the plurality of antennas is one of a columnar metal protrusion and a conical metal protrusion.

3. The light source apparatus according to claim 2, wherein, when a maximum width and a maximum height of the plurality of antennas are W1 and H, the maximum width W1 and the maximum height H satisfy a relationship of $0.6 \leq (H/W1) \leq 1.4$.

4. The light source apparatus according to claim 3, wherein the maximum width W1 of each of the plurality of antennas is 100 nm or more.

5. The light source apparatus according to claim 1, wherein each of the plurality of antennas is formed from one of Ag (silver) and Al (aluminum).

6. The light source apparatus according to claim 1, wherein the wavelength conversion member includes a light reflection film disposed on a side surface of the ceramic fluorescent material plate.

7. A light source apparatus comprising:
a laser light source which emits blue laser light;
a wavelength conversion member having a flat incident surface and a flat emitting surface, the wavelength conversion member generating wavelength-converted light by converting a wavelength of the blue laser light incident on the incident surface to emit the wavelength-converted light from the emitting surface, and the wavelength conversion member including a ceramic fluorescent material plate formed from a single phase yttrium aluminum garnet (YAG:Ce) ceramic;
a collimating optical system or a condensing optical system disposed between the laser light source and the wavelength conversion member; and
an antenna array including a plurality of antennas that are protrusions formed on the emitting surface of the wavelength conversion member and arranged at a pitch within a range of 300 nm to 420 nm, wherein each of the plurality of antennas are separated from each other on the emitting surface,
wherein, when a maximum width and a maximum height of the plurality of antennas are W1 and H, the maximum width W1 and the maximum height H satisfy a relationship of $0.6 \leq (H/W1) \leq 1.4$,
wherein each of the plurality of antennas is formed from one of Ag (silver) and Al (aluminum).

* * * * *